(12) United States Patent
Sandhu et al.

(10) Patent No.: US 8,011,296 B2
(45) Date of Patent: Sep. 6, 2011

(54) SUPERCRITICAL FLUID-ASSISTED DIRECT WRITE FOR PRINTING INTEGRATED CIRCUITS

(75) Inventors: Gurtej Sandhu, Boise, ID (US); Cem Basceri, Reston, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/232,913

(22) Filed: Sep. 25, 2008

(65) Prior Publication Data
US 2009/0095216 A1 Apr. 16, 2009

Related U.S. Application Data

(62) Division of application No. 11/135,453, filed on May 24, 2005, now Pat. No. 7,444,934.

(51) Int. Cl.
*B41L 27/00* (2006.01)
(52) U.S. Cl. .......................................... 101/123; 101/491
(58) Field of Classification Search .................. 101/123, 101/327
See application file for complete search history.

(56) References Cited

U.S. PATENT DOCUMENTS

| | | | |
|---|---|---|---|
| 4,013,502 A | 3/1977 | Staples | |
| 4,121,222 A * | 10/1978 | Diebold et al. | 347/7 |
| 4,582,731 A | 4/1986 | Smith | |
| 6,660,176 B2 | 12/2003 | Tepper et al. | |
| 6,666,986 B1 | 12/2003 | Vaartstra | |
| 6,728,092 B2 * | 4/2004 | Hunt et al. | 361/303 |
| 6,780,249 B2 | 8/2004 | Nelson et al. | |
| 6,827,823 B2 * | 12/2004 | Takikawa et al. | 204/173 |
| 7,041,608 B2 * | 5/2006 | Sieber et al. | 438/780 |
| 2003/0113481 A1 * | 6/2003 | Huang et al. | 427/580 |
| 2004/0096649 A1 * | 5/2004 | Nissinen et al. | 428/330 |
| 2004/0198066 A1 * | 10/2004 | Verhaverbeke | 438/745 |

* cited by examiner

*Primary Examiner* — Anthony H. Nguyen
(74) *Attorney, Agent, or Firm* — Dickstein Shapiro LLP

(57) ABSTRACT

High resolution patterns provided on a surface of a semiconductor substrate and methods of direct printing of such high resolution patterns are disclosed. The high resolution patterns may have dimensions less than 0.1 micron and are formed by a direct writing method employing a supercritical fluid comprising nanometer-sized particles, which may be optionally electrically charged.

15 Claims, 3 Drawing Sheets

SUPERCRITICAL FLUID-ASSISTED DIRECT WRITE FOR PRINTING INTEGRATED CIRCUITS

CROSS REFERENCE TO RELATED APPLICATIONS

The present application is a divisional of U.S. application Ser. No. 11/135,453, filed on May 24, 2005 now U.S. Pat. No. 7,444,934, the disclosure of which is incorporated by reference in its entirety herewith.

FIELD OF THE INVENTION

The invention relates to a method for direct writing integrated circuit (IC) patterns using printing techniques.

BACKGROUND OF THE INVENTION

Semiconductors and other electronic components need to be interconnected with each other to form circuits. As semiconductors continue to improve in performance, cost, reliability and miniaturization, there is an intensive need in the electronics industry to package and interconnect these semiconductors without limiting system performance. One approach in patterning metal lines on a substrate is the well-known photolithography technique. Although conventional photolithography is widely employed in the formation of patterns on a substrate, photolithography not only requires expensive chemicals and aligners/steppers, but also is typically the most time consuming and labor intensive step. Additionally, traditional photolithography optical aligners require very flat substrates due to the small depth of focus. This becomes an increasingly major drawback as larger substrates are used.

Various methods have been developed to overcome the drawbacks of photolithography and these methods relate to developing several maskless (or re-usable mask) techniques to direct-write metal lines and features on substrates. Such techniques include ink jet printing, offset printing, liquid metal ion sources, liquid metal cluster sources, laser direct-write, chemical vapor deposition, and electron-beam enhanced deposition, among others. Although these techniques have matured into relatively reliable processes, at present, none of these techniques have been widely accepted for manufacturing. Drawbacks arising from these techniques include low throughput, poor adhesion, high resistivity, high contact resistance, and poor resolution, among others.

Accordingly, there is a need for a method and apparatus for forming high resolution patterns on the surface of semiconductor substrates without requiring the use of photolithography. Also needed is a method and apparatus for forming high resolution patterns to achieve a very high packing density within a single IC chip.

BRIEF SUMMARY OF THE INVENTION

The present invention provides a method for printing high resolution patterns provided on a surface of a substrate. The high resolution patterns have dimensions less than 0.1 micron and are formed by a direct writing method employing a supercritical fluid comprising nanometer-sized particles, which may be optionally electrically charged.

The invention also provides a system for delivering a functional material comprising nanometer-sized particles that are dissolved or dispersed in a supercritical fluid, to produce high resolution patterns with dimensions less than 0.1 micron. The system for producing high resolution patterns includes a print head for delivering a functional material comprising nanometer-sized particles that are dissolved or dispersed in a supercritical fluid and then directing the functional material onto the surface of a substrate. A controlled environment exposes the substrate to receive the functional material as a patterned deposition on the substrate. Optionally, the system may include means for electrically charging the nanometer-sized particles of the functional material dissolved or dispersed in the supercritical fluid.

The invention also provides a method of forming high resolution patterns by employing a supercritical fluid comprising nanometer-sized particles, which may be optionally electrically charged. The method of the present invention comprises the steps of: (i) providing nanometer-sized particles of the material which will form the high resolution pattern; (ii) dissolving the nanometer-sized particles in a supercritical fluid to form a suspension solution; (iii) optionally, charging the nanometer-sized particles to a predefined electrical charge; and (iv) dispensing the suspension solution on the surface of a substrate to form high resolution patterns having dimensions less than 0.1 micron.

The above and other advantages and features of the invention will be more clearly understood from the following detailed description which is provided in connection with the accompanying drawings.

DETAILED DESCRIPTION OF THE INVENTION

Figure 1:
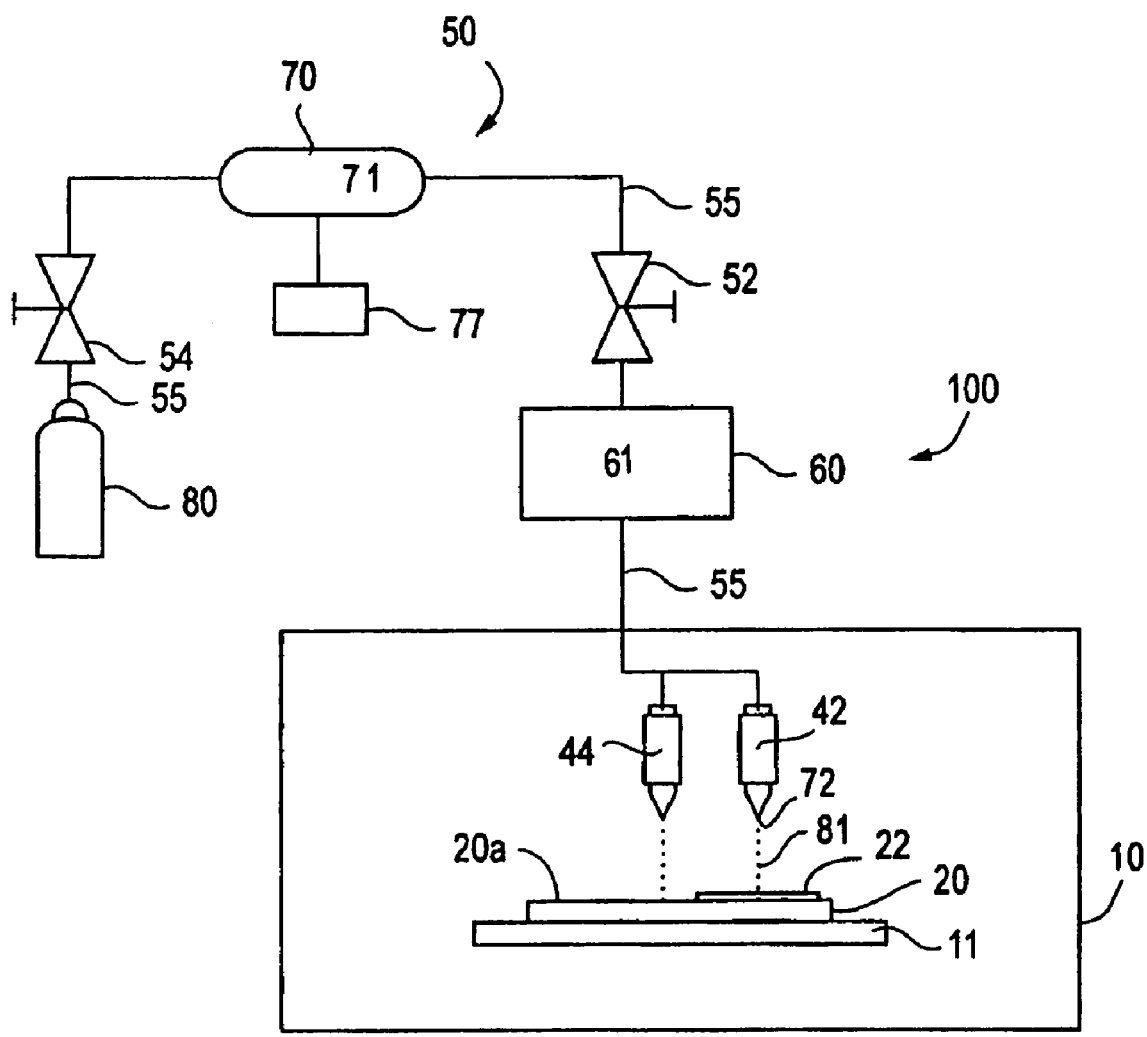
FIG. 1 illustrates a schematic cross-sectional view of a direct write system according to a first embodiment of the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "supercritical fluid" relates to materials that are at a temperature and pressure which allows them to be at, above, or slightly below their critical point (the critical point is defined by a critical temperature and a critical pressure). The critical temperature and critical pressure typically define a thermodynamic state in which a fluid or a material becomes supercritical and exhibits gas-like and liquid-like properties. Materials that are at sufficiently high temperatures and pressures below their critical point are known as compressed liquids. Materials in their supercritical fluid and/or compressed liquid state that exist as gases at ambient conditions have the unique ability to solubilize and/or disperse functional materials of interest when in their compressed liquid or supercritical state.

In addition, the term "supercritical fluid" may also include near-supercritical fluids. For example, the supercritical fluid may be a substance that is a gas at standard temperature and pressure (i.e., about 1 atmosphere and 25° C.) but is at a density greater than a critical density of the gas. The supercritical fluid may be a substance that is a liquid at standard temperature and pressure, but is at a temperature greater than a critical temperature of the liquid and at a pressure greater than a critical pressure of the liquid.

The terms "nano-sized particles," "nanometer-sized particles" and "nano-particles" are used interchangeably in the present application and they denote particles having a size that can vary within a wide range of about 1 Angstroms to 40 micrometers, preferably within the range of about 10 to 1,000 Angstroms. The choice of particle size is dependent upon the available orifice size for the nozzles used in ink jet printing, and upon the width and height of the desired pattern features.

As described below, the suspension solutions or formulations formed in the process of the present invention contain a functional material which is dispersed in a supercritical fluid, preferably carbon dioxide ($CO_2$) fluid having a density greater than 0.1 g/cm$^3$. The carbon dioxide fluid may be in the form of a compressed gas and/or a compressed liquid, which is maintained at a temperature and a pressure suitable for the formation of a dispersion of aggregates of the functional material in the compressed fluid. Preferably, the formulation conditions are temperatures in the range of from 0 to 100° C. and pressure in the range from 1 to about 400 atm, more preferably temperatures from 10 to 60° C. and pressure from 40 to about 400 atm.

Carbon dioxide has unique physical properties and, in general, only a small class of materials are known which have appreciable solubility in $CO_2$. These materials that have appreciable solubility are termed $CO_2$-philic. Materials that are substantially insoluble in $CO_2$ are termed $CO_2$-phobic. In accordance with the invention, functional materials which are substantially insoluble in compressed $CO_2$ are dispersed in a continuous compressed $CO_2$ phase optionally with the aid of surfactants having a $CO_2$-philic portion and a $CO_2$-phobic portion having affinity to the functional material. A surfactant may be added to the suspension solution to interact with the functional material and the compressed carbon dioxide. Other supercritical fluids such as $NH_3$, $H_2O$, etc. may be also used.

The functional materials may be selected from species which are substantially insoluble in the supercritical carbon dioxide in the absence of a surfactant. Substantial insolubility is defined herewith as solubility of less than 0.1 wt %, more preferably less than 0.05 wt %, in supercritical carbon dioxide at the temperature and pressure of the suspension solution. Such functional materials may be any metallic, alloy, ceramic, organic, inorganic, metallo-organic, polymeric, oligomeric, a synthetic and/or natural polymer material, as well as any composite material of these previously-mentioned materials, which may be provided in the form of nanometer-sized particles or particulates. Functional materials may also be dyes or pigments, or other substances whose desired form is that of a fine pattern film on a substrate.

Referring now to the drawings, where like elements are designated by like reference numerals, FIG. 1 illustrates a schematic cross-sectional view of a system 100 for direct-writing high resolution patterns on a portion of an exemplary substrate according to an embodiment of the present invention.

As shown in FIG. 1, system 100 includes a delivery system 50 for writing on a substrate 20 (for example, a semiconductor substrate 20) which is retained in a deposition chamber 10 and supported by a support 11. The delivery system 50 delivers nanometer-sized particles of a functional material that is dissolved or dispersed in a supercritical fluid along fluid delivery path 55. The delivery system 50 generally includes a source 80 of supercritical fluid 81, a functional material reservoir 70 for containing a functional material 71, and a discharge or dispensing assembly 60 for dispensing a suspension solution 61 (comprising supercritical fluid 81 and functional material 71). Delivery system 50 enables the dissolution and/or dispersal of the selected functional material into the supercritical fluid and allows the formation of a solution and/or dispersion of the appropriate functional material (or combination of functional materials) in the chosen supercritical fluid. Delivery system 50 also delivers the suspension solution 61 of the dispensing assembly 60 as a beam or spray, for example, into chamber 10 in a controlled manner.

Delivery system 50 is shown in fluid communication through orifices/nozzles 42, 44 with enclosed chamber 10 that contains substrate 20. As depicted in FIG. 1, enclosed chamber 10 (for example, a deposition chamber) is arranged proximate to delivery system 50. Chamber 10 is positioned at one end of the fluid delivery path 55 and adjacent the discharge assembly 60 of delivery system 50, although it may be also placed at a distance. Substrate 20 to be patterned with functional material is suitably arranged within chamber 10.

According to FIG. 1, valve 52 may be designed to actuate with a specific frequency, or for a fixed time period, to permit the controlled release of functional material 71 from reservoir 70 into the dispensing assembly 60 and further into enclosed chamber 10 via orifices/nozzles 42, 44. The controlled release of the suspension solution 61 into enclosed chamber 10 through orifices/nozzles 42, 44 results in the evaporation of the compressed fluid 81 and the precipitation and/or aggregation of the dissolved and/or dispersed functional material 71 on surface 20a of the substrate 20.

Discharge or dispensing assembly 60 is utilized to dissolve and/or disperse nanometer-sized particles 72 of the functional materials 71 in supercritical fluid 81, with or without solvents and/or dispersants and/or surfactants, at desired formulation conditions of temperature, pressure, volume, and concentration. The formulation may include additives to modify surface tension, and/or modifiers, thickeners, stabilizers, binders or dopants for adjusting the viscosity or other physical characteristics of the resulting suspension solution. As detailed below, functional materials 71 may be any material that needs to be delivered to substrate 20, for example, metals or dielectrics, among many others.

Substrate 20 may be any solid including a semiconductor, an organic, an inorganic, a metallo-organic, a metallic, an alloy, a ceramic, a synthetic and/or natural polymeric, a gel, a glass, a plastic and a composite material. Substrate 20 may be porous or non-porous. Additionally, the substrate 20 can have more than one layer and may be flexible or rigid. Further, when a semiconductor substrate is employed, previous process steps may have been utilized to form regions or junctions in the base semiconductor structure or foundation, as well as additional integrated circuit structures and/or devices fabricated over the surface of such semiconductor substrate. The semiconductor need not be silicon-based, but could be based on other single element or compound semiconductors such as germanium-silicon-germanium, gallium arsenide, or indium phosphide, among many others. Other types of substrates may have previously formed patterns on them.

In the process according to the invention and described in more detail below, functional material 71 (or a combination of such functional materials) in the form of nanometer-sized particles 72 is dissolved or mixed in supercritical fluid 81 to form suspension solution 61, and then deposited on substrate 20 by an ink jet printing technique, for example, to form high resolution patterns 22. The materials to be deposited are formulated as colloidal suspensions and then, using ink jet printing techniques, the suspensions are directly written onto substrate surface 20a.

A wide range of dispensing assemblies and devices can be selected for use in practicing the present method. Dispensing device 60 may contain an inkjet printhead, liquid droplet generator, extrusion device, gear pump, air pressure pump, positive displacement pump, screw-driven pump, syringe pump, fused deposition modeling nozzle, or a combination thereof. These devices are well known in the art of liquid dispensing and inkjet printing. A plurality of dispensing devices (having a plurality of nozzles or nozzle orifices) may be used to deposit different material compositions sequentially or concurrently. The ink jet printing technique, e.g., a piezoelectric driven jet system, can either be a continuous or pulsed delivery, e.g., drop on demand. Following the printing step, the deposited material may be thermally, laser annealed.

In operation, a suspension solution 61 comprising a functional material 71 (or a combination of such functional materials) in a supercritical fluid 81 is first prepared in the dispensing assembly 60 of the invention. As noted above, the supercritical fluid 81 is preferably compressed carbon dioxide, due to its low cost and high availability. However, nitrous oxide, ammonia, water, xenon, ethane, ethylene, propane, propylene, butane, isobutane, chlorotrifluoromethane, monofluoromethane, sulphur hexafluoride and mixtures thereof, may be used also as the supercritical fluid 81.

Functional material 71 may be any material of interest in solid or liquid phase which can be dispersed and/or dissolved in the supercritical fluid 81 resulting in suspension solution 61. Functional material 71 comprises nanometer-sized particles 72 having various shapes and sizes depending on the type of the functional material 71 used in the formulation. In general, an atomizer 77 (FIG. 1) is responsible for reducing or dividing the functional material 71 into discrete particles and particulates. The size of the discrete particles may be controlled by the interaction of the physical properties of the functional material and/or the atomizer. Any device or means that forms relatively smaller particles from larger particles from a reservoir or fluid may be employed as atomizer 77. Thus, in accordance with various embodiments of the invention, the atomizer may comprise a device that utilizes a pneumatic or ultrasound device, or that employs a spray process, or condenses particles from a vapor.

Once the supercritical fluid 81 is added to the functional material 71 comprising nanometer-sized particles 72, the particles are dispersed or dissolved within the supercritical fluid to form suspension solution 61 contained within the dispensing assembly 60. The suspension solution 61 (i.e., the functional material 71 and the supercritical fluid 81) is maintained at a suitable temperature and a suitable pressure for the functional material 71 and the supercritical fluid 81 used in a particular application.

The contents of the dispensing assembly 60 are suitably mixed using a mixing device (not shown) to ensure intimate contact between the functional material 71 and supercritical fluid 81. As the mixing process proceeds, the nanometer-sized particles 72 are dissolved and/or dispersed within the supercritical fluid 81. The process of dissolution/dispersion, including the amount of functional material 71 and the rate at which the mixing proceeds, depends upon the functional material 71 itself, the particle size and particle size distribution of the functional material 71, the supercritical fluid 81 used, the temperature, and the pressure within the dispensing assembly 60.

When the mixing process is complete, the mixture or formulation 61 of nanometer-sized particles and supercritical fluid is thermodynamically stable in that the functional material is dissolved or dispersed within the compressed fluid so that it is indefinitely contained in the same state as long as the temperature and pressure within the dispensing assembly 60 are maintained constant or in the same state for the period of the efficient operation of the process.

Next, the nanometer-sized particles 72 of the functional material 71 (for example, a metal or a dielectric) are written directly onto the surface 20a of the substrate 20. As suspension solution 61 is ejected from nozzles 42, 44 of the discharge assembly 60, nanometer-sized particles 72 precipitate on the surface 20a of the substrate 20 forming high resolution patterns 22 while the supercritical fluid 81 evaporates. As described above, an ink jet printing technique may be employed for the formation of the high resolution pattern 22. In this manner, the several process steps involved with photoresists and photolithography which require excessive handling (photoresist deposition, exposure to irradiation, and then development by solvent treatment) are essentially eliminated. Another advantage is that the ink jet printing process is suitable for depositing a wide variety of substances, and thus is not limited to any specific materials as are the processes of evaporation, sputtering and chemical vapor deposition.

Any material which can be mechanically ground or chemically formed as nanosized particles can be deposited by the process according to the invention. Accordingly, the process of the invention contemplates depositing pure metals, such as Au, Cu, Pt, and Ag, complex alloys of such metals, as well as refractory metals, such as W, Ta, Mo or SiC. Dielectrics such as $SiO_2$, which are commonly deposited by complicated chemical vapor deposition techniques, can also be deposited by the simpler ink jet printing process of the invention. Additionally, superconductive materials such as yttrium barium copper oxide ($YBa_2CuO_7$) may be dispensed onto the surface substrate according to embodiments of the present invention.

During printing, the surface 20a of the substrate 20 may be set perpendicular to the flowing direction of the suspension solution 61, as shown in FIG. 1. Alternatively, the surface of the substrate 20 may be also positioned at an angle with the flowing direction of the suspension solution 61. In addition, although only one substrate is shown in FIG. 1, the invention is not limited to this embodiment and also contemplates a plurality of substrates held in the chamber 10 and concurrently or sequentially subjected to the direct patterning method of the present invention.

Pattern 22 of FIG. 1 formed according to the present invention is a high resolution pattern having dimensions less than 0.1 micron. Thus, for the purposes of the present invention, the term "high resolution pattern" is defined as a pattern having dimensions less than about 0.1 micron. The high resolution pattern 22 of FIG. 1 may be part of discrete passive and/or active electronic devices on circuit boards, as well as electrical connections as part of functioning IC devices. For example, the high resolution pattern 22 may be a very fine featured metallic pattern as part of an IC device.

Figure 2:
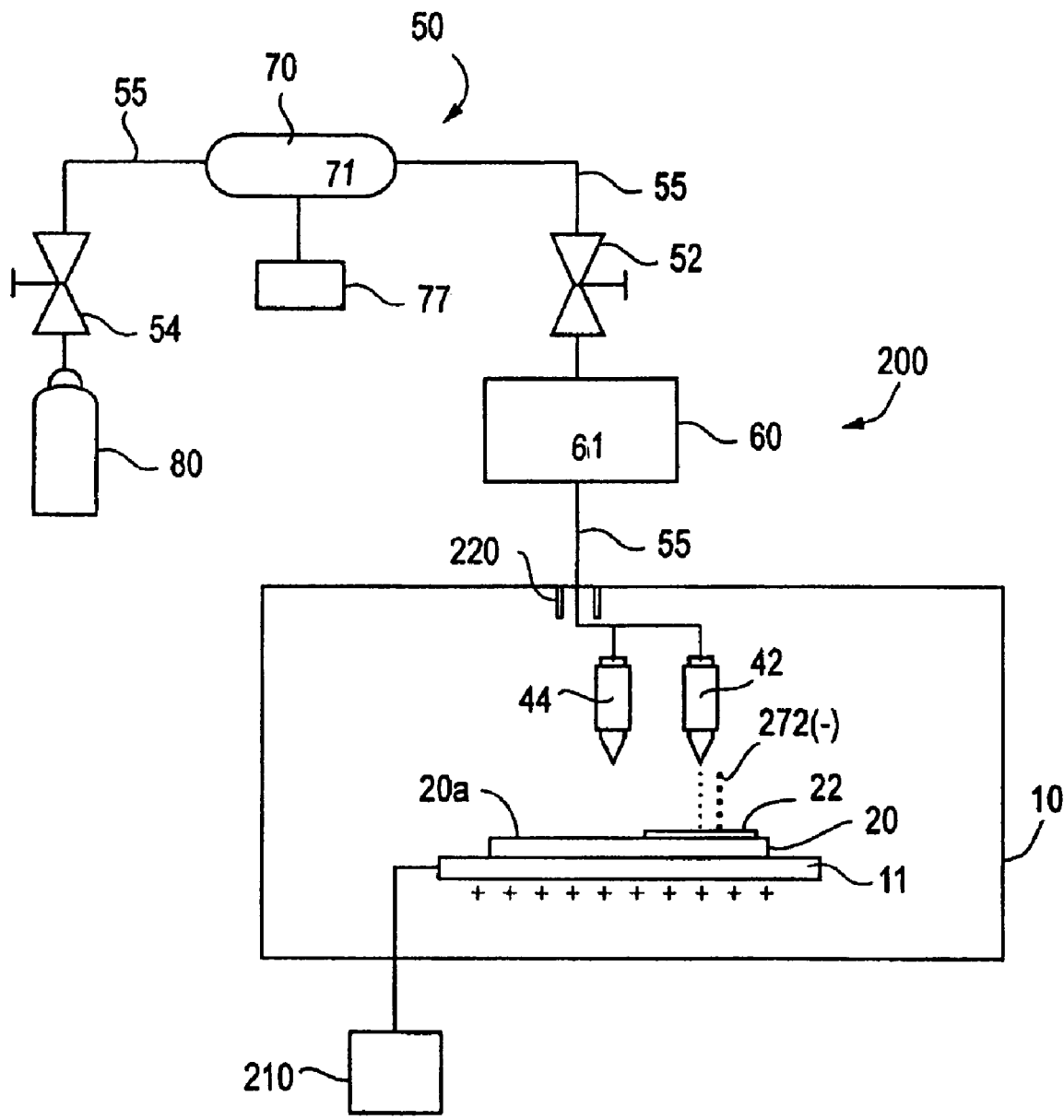
FIG. 2 illustrates a schematic cross-sectional view of a direct write system according to a second embodiment of the present invention.

Reference is now made to FIG. 2, which illustrates system 200 according to another embodiment of the present invention. To enable a more complete and even distribution of the nanometer-sized particles 72 of the functional material 71, electric or electrostatic charges can be applied to the substrate 20 and to the nanometer-sized particles of the functional material 71. Thus, the system 200 is similar to system 100 of the first embodiment, with the exception that the substrate 20 and the nanometer-sized particles 72 are electrically charged in the second embodiment.

Charge can be applied to the nanometer-sized particles 72 using a particle charging device 220 (FIG. 2). The electrically charged nanometer-sized particles 272 can be focused by external electromagnetic or electrostatic fields, and they can be attracted or repelled from various surfaces to aid in the deposition process. Charging device 210 is provided for the substrate 20. For illustrative purposes only, a positive charge (+) is shown on substrate 20 and a negative charge (−) is shown on the charged nanosized-particles 272. The polarity may be reversed according to the specifics of each application. The polarity mat be pulsed at a certain fixed or varying frequency during the writing process. This can prevent the jet stream from blowing up and keeping the writing feature to small, well controlled size. In a similar manner, it may be beneficial to create other electric or electrostatic charges on the deposition chamber 10 or on any other mechanical elements within the deposition chamber 10.

Alternatively, the dispensing assembly 60 can include a source that electrically charges the material nanometer-sized particles prior to the particles being ejected from the discharge assembly 60. As material stream becomes charged, it is ejected from the discharge assembly 60 and through nozzles 42, 44 deposited onto the surface 20a of the substrate 20.

Figure 3:
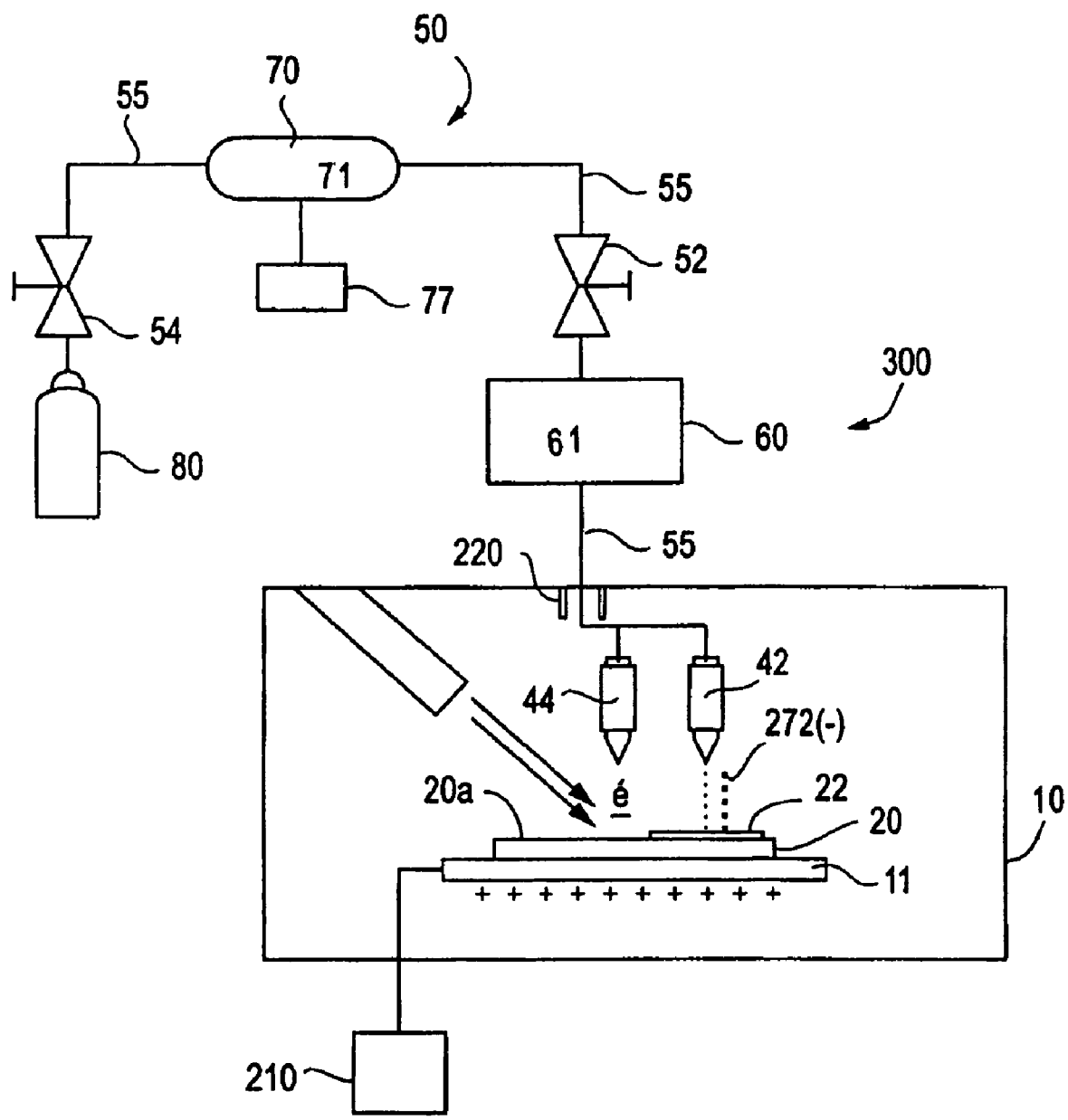
FIG. 3 illustrates a schematic cross-sectional view of a direct write system according to a third embodiment of the present invention.

FIG. 3 illustrates yet another embodiment of the present invention according to which system 300 includes an electron gun 330 which shoots electrons at the substrate 20. According to this embodiment, electrons of the electron gun 330 help neutralize the charge up caused by deposition of the charge particles, preventing therefore the jet stream from blowing up and keeping the writing feature small and with a well controlled size.

Although the present invention has been described above with reference to the formation of a high resolution pattern, such as the high resolution pattern 22 of FIGS. 1, 2 and 3, using a suspension solution consisting of nanometer-sized particles dissolved or dispersed within a supercritical fluid, the invention is not limited to these embodiments. Accordingly, the invention also contemplates a suspension solution for direct writing of integrated circuits additionally comprising a solvent or liquid medium which is added to the suspension solution 61, based upon the material to be deposited and also the ease of evaporation. A volatile solvent is preferred since it can easily be evaporated without requiring the application of excessive temperatures which may result in an undesired modification of substrate surface chemistry. Examples of suitable solvents are water, acetone, lower alcohols such as butanol, methanol and ethanol, low boiling hydrocarbons such as hexane, benzene and toluene, and halogenated hydrocarbons such as methylene chloride.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A system for the maskless writing of a pattern on a substrate, comprising:
   a support;
   an unmasked substrate supported by the support;
   a discharge assembly for masklessly discharging a solution directly to a surface of the unmasked substrate, the solution comprising nanometer-sized particles dissolved or dispersed in a supercritical fluid; and
   a charging device for electrically charging the nanometer-sized particles.

2. The system of claim 1, wherein the supercritical fluid is selected from the group consisting of carbon dioxide, nitrous oxide, ammonia, xenon, ethane, ethylene, propane, propylene, butane, isobutane, chlorotrifluoromethane, monofluoromethane and sulphur hexafluoride.

3. The system of claim 1, wherein the supercritical fluid is carbon dioxide.

4. The system of claim 1, wherein the nanometer-sized particles are solid particles, or a combination of solid and liquid particles.

5. The system of claim 1, wherein the pattern is a high resolution pattern having dimensions less than 0.1 micron.

6. The system of claim 1, wherein the discharge assembly further comprises at least one nozzle for hole injecting the solution.

7. The system of claim 1 further comprising a second charging device for electrically charging the substrate.

8. The system of claim 7, wherein the substrate and nanometer-sized particles have opposite polarity and the charging devices are capable of pulsing the polarity at a chosen frequency.

9. The system of claim 1, further comprising an electron gun that shoots electrons at the substrate.

10. The system of claim 1, wherein the solution further comprises a solvent.

11. The system of claim 10, wherein the solvent is selected from the group consisting of water, acetone, lower alcohols, low boiling hydrocarbons, and halogenated hydrocarbons.

12. The system of claim 1, further comprising an atomizer for reducing particles of a predetermined size of a functional material to form nanometer-sized particles of the functional material, which are dissolved or dispersed in said supercritical fluid.

13. The system of claim 1, further comprising a reservoir in which the nanometer-sized particles are combined with the supercritical fluid to form the solution.

14. The system of claim 1, wherein the nanometer-sized particles are metal particles.

15. The system of claim 1, wherein the nanometer-sized particles are dielectric particles.

* * * * *